United States Patent
Lou et al.

(10) Patent No.: US 10,304,875 B2
(45) Date of Patent: May 28, 2019

(54) DISPLAY PANEL, ARRAY SUBSTRATE, AND FABRICATION METHOD THEREOF

(71) Applicants: Shanghai Tianma Micro-Electronics Co., Ltd., Shanghai (CN); Tianma Micro-Electronics Co., Ltd., Shenzhen (CN)

(72) Inventors: Junhui Lou, Shanghai (CN); Tianyi Wu, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 3 days.

(21) Appl. No.: 15/492,035

(22) Filed: Apr. 20, 2017

(65) Prior Publication Data

US 2017/0221925 A1    Aug. 3, 2017

(30) Foreign Application Priority Data

Dec. 13, 2016   (CN) .......................... 2016 1 1147799

(51) Int. Cl.
  *H01L 29/66*   (2006.01)
  *H01L 27/12*   (2006.01)
  (Continued)

(52) U.S. Cl.
  CPC .......... *H01L 27/127* (2013.01); *H01L 21/465* (2013.01); *H01L 27/1225* (2013.01);
  (Continued)

(58) Field of Classification Search
  CPC ............... H01L 27/127; H01L 27/1225; H01L 27/1248; H01L 21/465; H01L 29/66969; H01L 29/7869
  See application file for complete search history.

(56) References Cited

U.S. PATENT DOCUMENTS

2006/0091471 A1* 5/2006 Frohberg .......... H01L 21/31116
                                                    257/369
2006/0139289 A1* 6/2006 Yoshida ................. G09G 3/342
                                                     345/98
(Continued)

FOREIGN PATENT DOCUMENTS

CN    101546768 A    9/2009
CN    103887343 A    6/2014
(Continued)

*Primary Examiner* — Timor Karimy
(74) *Attorney, Agent, or Firm* — Anova Law Group, PLLC

(57) ABSTRACT

The disclosure provides a display panel, an array substrate and a fabrication method thereof. The fabrication method of the array substrate includes forming a plurality of first thin film transistors and a plurality of second thin film transistors on the first substrate. The etch stopper layer of the second thin film transistor is different from an etch stopper layer of the first thin film transistor, and a threshold voltage of the second thin film transistor is higher than a threshold voltage of the first thin film transistor. By using the disclosed thin film transistors to form the gate driving circuit, the second thin film transistor with a high threshold voltage can be used as the driving signal outputting transistor. The abnormal multi-pulse of the gate driving circuit and the display panel caused by the low threshold voltage of the second thin film transistors may be therefore avoided.

9 Claims, 9 Drawing Sheets

(51) Int. Cl.
*H01L 21/465* (2006.01)
*H01L 29/786* (2006.01)

(52) U.S. Cl.
CPC .... *H01L 27/1248* (2013.01); *H01L 29/66969* (2013.01); *H01L 29/7869* (2013.01)

(56) References Cited

U.S. PATENT DOCUMENTS

2011/0163310 A1   7/2011  Park et al.
2016/0254282 A1*  9/2016  Lv .......................... H01L 21/77
                                                                        257/43

FOREIGN PATENT DOCUMENTS

| CN | 104183608 A | 12/2014 |
| CN | 104241298 A | 12/2014 |
| CN | 105573549 A | 5/2016 |

* cited by examiner

DISPLAY PANEL, ARRAY SUBSTRATE, AND FABRICATION METHOD THEREOF

CROSS-REFERENCES TO RELATED APPLICATIONS

This application claims the priority of Chinese patent application No. CN201611147799.2, filed on Dec. 13, 2016, the entire content of which is incorporated herein by reference.

FIELD OF THE DISCLOSURE

The present disclosure relates to the field of display technology and, more particularly, relates to a display panel, an array substrate, and fabrication techniques thereof.

BACKGROUND

With the development of the display technology, the display panel has been used in various applications. As an important component of the display panel, the array substrate plays a decisive role for the performance of the display panel.

The thin film transistor (TFT) arranged on the array substrate and the external driving circuit are essential components to control the pixels of the display panel to display images. In the conventional technology, the oxide TFT is mostly used to form the TFT on the array substrate. The oxide TFT has advantages of the α-Si TFT and the low temperature poly-silicon (LTPS) TFT, and can improve the resolution of the display panel and has a low manufacture cost. Hence, the oxide TFT provides a probability of fabricating the array substrate in a large size.

However, the oxide TFT is especially sensitive to the environmental moisture and oxygen, and process parameter change, which may affect the threshold voltage. When the threshold voltage is too low, the gate driving circuit of the array substrate may have an abnormal multi-pulse condition, and the display panel may have an abnormal display.

The disclosed display panel, display device, array substrate, and fabrication method are directed to solving at least partial problems set forth above and other problems.

BRIEF SUMMARY OF THE DISCLOSURE

One aspect of the present disclosure provides a method for fabricating an array substrate. The method includes providing a first substrate; and forming a plurality of first thin film transistors and a plurality of second thin film transistors on the first substrate, wherein an etch stopper layer of the second thin film transistor is different from an etch stopper layer of the first thin film transistors, and a threshold voltage of the second thin film transistors is higher than a threshold voltage of the first thin film transistors.

Another aspect of the present disclosure provides an array substrate. The array substrate includes a first substrate; and a plurality of first thin film transistors and a plurality of second thin film transistors located on the first substrate, wherein an etch stopper layer of the second thin film transistor is different from an etch stopper layer of the first thin film transistors, and a threshold voltage of the second thin film transistors is higher than a threshold voltage of the first thin film transistors.

Another aspect of the present disclosure provides a display panel. The display panel includes a counter substrate; and an array substrate. The array substrate includes a first substrate; and a plurality of first thin film transistors and a plurality of second thin film transistors located on the first substrate, wherein an etch stopper layer of the second thin film transistor is different from an etch stopper layer of the first thin film transistors, and a threshold voltage of the second thin film transistors is higher than a threshold voltage of the first thin film transistors.

Another aspect of the present disclosure provides a display device. The display device includes a display panel. The display panel includes a counter substrate; and an array substrate. The array substrate includes a first substrate; and a plurality of first thin film transistors and a plurality of second thin film transistors located on the first substrate, wherein an etch stopper layer of the second thin film transistor is different from an etch stopper layer of the first thin film transistors, and a threshold voltage of the second thin film transistors is higher than a threshold voltage of the first thin film transistors.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
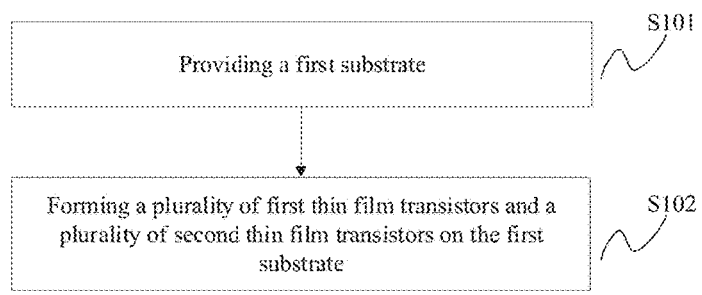
FIG. 1 illustrates a flow chart of an exemplary fabrication process of an array substrate consistent with disclosed embodiments.

FIG. 1 illustrates a flow chart of an exemplary fabrication process of an exemplary array substrate consistent with disclosed embodiments. As shown in FIG. 1, the disclosed embodiments provide a method for fabricating an array substrate. The method includes providing a first substrate (S101), and forming a plurality of first thin film transistors and a plurality of second thin film transistors on the first substrate (S102). An etch stopper layer of the second thin film transistor is different from an etch stopper layer of the first thin film transistors, and a threshold voltage of the second thin film transistors is higher than a threshold voltage of the first thin film transistors.

It should be noted that the first substrate may be a glass substrate, a quartz substrate, or a polyimide film substrate, which are not intended to limit the scope of the present invention.

It should also be noted that, according to the present disclosure, when the threshold voltage of the thin film transistor used as the driving signal output in the gate driving circuit is less than 3V, an abnormal multi-pulse might be outputted by the gate driving circuit. When the threshold voltage of the thin film transistor used as the driving signal output in the gate driving circuit is less than 0V, the abnormal multi-pulse is surely outputted by the gate driving circuit. Thus, in the present application, the threshold voltage of the thin film transistor may be deemed as too low when the threshold voltage is less than approximately 3V.

Further, according to the present disclosure, the threshold voltage of the thin film transistor may be changed when either the film forming process, thickness or material of the etch stopper layer is changed. For example, when silicon dioxide is used as an etch stopper layer, the silicon dioxide is generally formed by a chemical vapor deposition (CVD) process and nitrous oxide gas and silane gas are generally used in the CVD process.

During the formation of silicon dioxide, when the ratio of nitrous oxide and silane is high, the oxide layer is oxidized sufficiently and the oxide layer has a less hydrogen content. Thus, the threshold voltage of the finally formed thin film transistor is higher. However, it may be possible to make the oxide layer also has unstable oxygen doping, and the stability of the finally formed thin film transistor may be reduced (especially for the positive bias stability). When this kind of thin film transistors is used as the driving thin film transistor to form the pixel driving layer on the array substrate, the threshold voltage shifting will cause an abnormal image on the display panel using this array substrate (for example, residual images and brightness unevenness).

When the ratio of nitrous oxide and silane is low, the threshold voltage of the finally formed thin film transistor is low but the stability is high. When a higher film-forming power is used in the CVD process to form the silicon dioxide, the oxide semiconductor material is sufficiently oxidized, and therefore the formed thin film transistor has a higher threshold voltage and a worse stability under the positive bias.

When the physical vapor deposition (PVD) process is used to form the silicon dioxide as the etch stopper layer, the silane gas is not required during the forming process of the silicon dioxide, and thus, the oxide semiconductor contains less hydrogen. Comparing to the thin film transistor having etch stopper layer formed by the CVD process, the thin film transistor having etch stopper layer formed by the PVD process may have a higher threshold voltage. When different materials are selected to form the etch stopper layer, the hydrogen contained in the oxide semiconductor layer may affect the threshold voltage of the finally formed thin film transistors.

In the disclosed embodiments, the method for fabricating the array substrate comprises forming a plurality of first thin film transistors and a plurality of second thin film transistors having different threshold voltages on the first substrate. The etch stopper layer of the second thin film transistor is different from the etch stopper layer of the first thin film transistor, and thus the threshold voltage of the second thin film transistor is higher than the threshold voltage of the first thin film transistor.

When the thin film transistors are used to form the gate driving circuit, the second thin film transistors with a high threshold voltage may be used for forming the driving signal outputting thin film transistors of the gate driving circuit. Thus, the abnormal multi-pulse condition of the gate driving circuit caused by the low threshold voltage of the driving signal outputting thin film transistors of the gate driving circuit may be avoided. When the thin film transistors are used to form the pixel driving layer, the first thin film transistors with a low threshold voltage may be used for driving the display pixels. The first thin film transistors have a better stability, and therefore the abnormal display condition caused by the threshold voltage shifting may be avoided.

Figure 2:
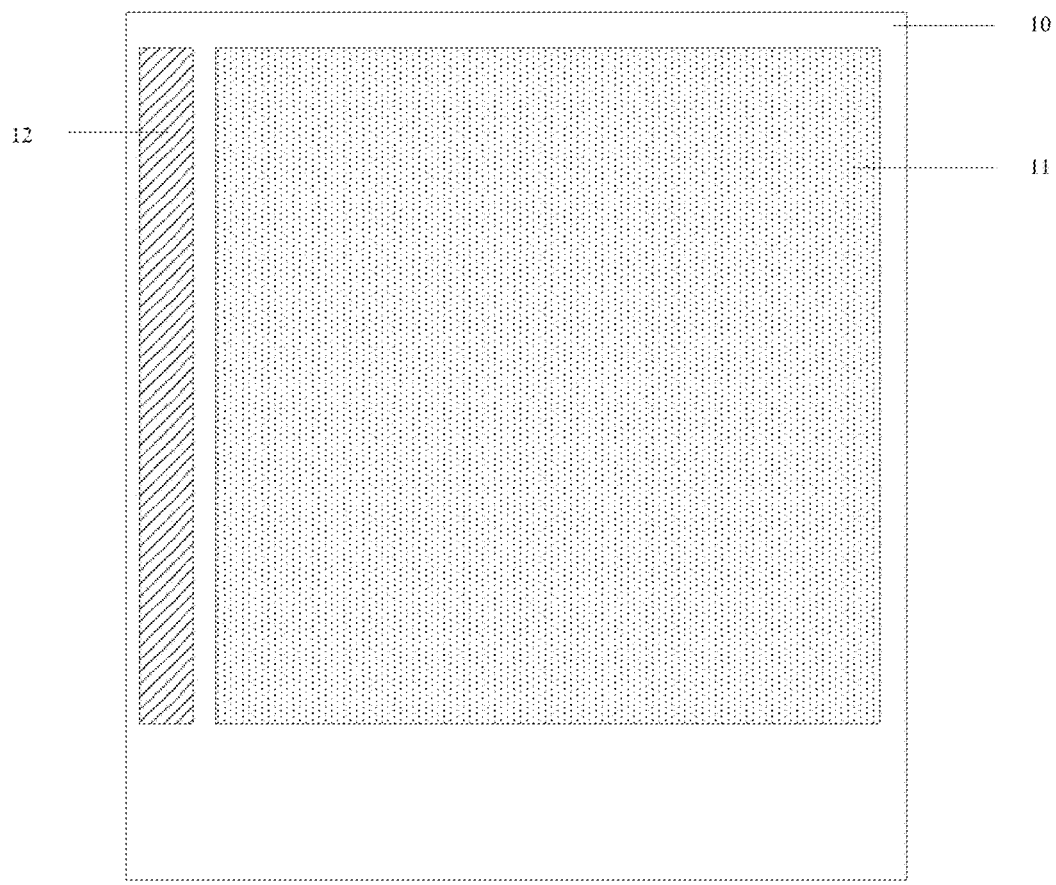
FIG. 2 illustrates a top view of an exemplary first substrate consistent with disclosed embodiments.

Based on the above disclosed embodiments, in another embodiment of the disclosure, the first substrate comprises a display region and a function region. FIG. 2 illustrates a top view of an exemplary first substrate consistent with disclosed embodiments. As shown in FIG. 2, the first substrate 10 includes the display region 11 and the function region 12. The display region 11 is located on one surface of the first substrate 10 and is in the central region of the surface. The function region 12 is the region on the first substrate 10 excepting the display region 11. For example, in FIG. 2, the function region 12 is located on one side of the display region 11. In other embodiments, the function region 12 may be located on two opposite sides of the display region 11.

Figure 3:
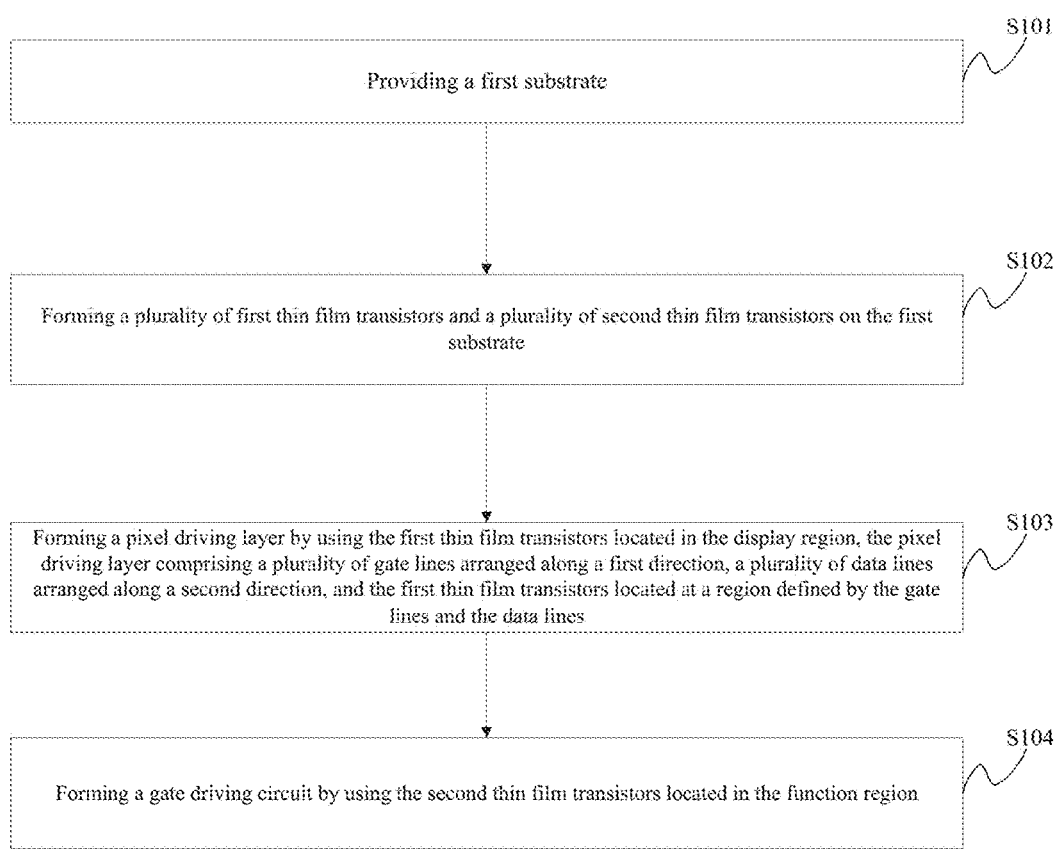
FIG. 3 illustrates a flow chart of another exemplary fabrication process of an array substrate consistent with disclosed embodiments.

FIG. 3 illustrates a flow chart of another fabrication process of an exemplary array substrate consistent with disclosed embodiments. As shown in FIG. 3, after forming the first thin film transistors and the second thin film transistors on the first substrate, the method further includes:

S103: Forming a pixel driving layer by using the first thin film transistors located in the display region. The pixel driving layer includes a plurality of gate lines arranged along a first direction, a plurality of data lines arranged along a second direction, and the first thin film transistors located at a region defined by the gate lines and the data lines; and S104: Forming a gate driving circuit by using the second thin film transistors located in the function region.

Figure 4:
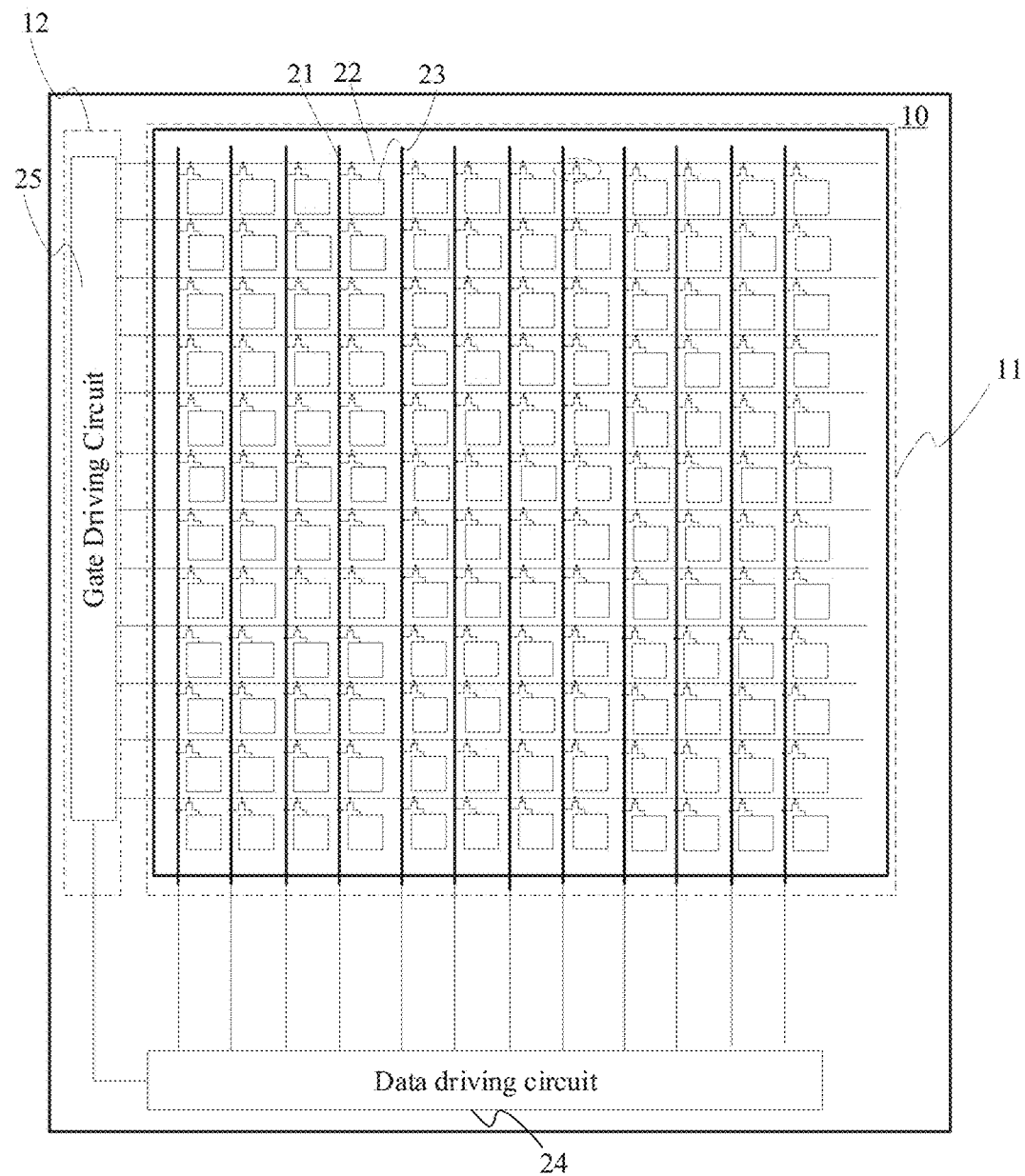
FIG. 4 illustrates a top view of an exemplary array substrate consistent with disclosed embodiments.

FIG. 4 illustrates a top view of an exemplary array substrate consistent with disclosed embodiments. As shown in FIG. 4, the pixel driving layer is formed on the surface of the display region 11 of the first substrate 10. The pixel driving layer includes the gate lines 22 arranged along a first direction, the data lines 21 arranged along a second direction, and the thin film transistors and the display pixel regions 23 located at a region defined by the gate lines 22 and the data lines 21. The display pixel regions 23 are used to form the pixel electrodes. The gate driving circuit 25 is formed on the surface of the function region 12.

In the disclosed embodiments, the gate driving circuit 25 includes a plurality of thin film transistors (not shown). The second thin film transistors with a high threshold voltage are used for forming the driving signal outputting thin film transistors of the gate driving circuit 25. Therefore, the abnormal multi-pulse condition of the gate driving circuit caused by the low threshold voltage of the driving signal outputting thin film transistors of the gate driving circuit may be avoided.

In the disclosed embodiments, the first thin film transistors and the second thin film transistors include the gate electrodes, the semiconductor layers, the source electrodes and the drain electrodes. When an open signal is inputted to the gate electrode, the carriers flow in the semiconductor layer and conduct the source electrode and the drain electrode. In the disclosed embodiments, the semiconductor layers of the first thin film transistors and the second thin film transistors may be oxide semiconductor layers. Because the oxide semiconductor is sensitive to the moisture and the moisture permeation may cause the performance degradation of the oxide semiconductor layers, the etch stopper layers are generally formed on the oxide semiconductor layers to insulate the moisture during the fabrication process.

As shown in FIG. 4, the array substrate further includes the data driving circuit 24. The data driving circuit 24 is electrically coupled to the data lines 21. The data driving circuit 24 outputs the display data signals to the display pixels during the display periods through the data lines 21, and thus controls the images displayed on the display panel having the array substrate. The gate driving circuit 25 is electrically coupled to the gate lines 22. The gate driving circuit 25 provides the scanning signals to the first thin film transistors during the display periods through the gate lines 22, and thus controls the opening or closing status of the first thin film transistors.

The gate lines 22 and the data lines 21 may be formed by using the magnetron sputtering process to form the conductive film, and forming the patterns after the etching process. The gate lines 22 and the data lines 21 may be also formed by using the thermal evaporation process or the CVD process to form the conductive film, and forming the patterns after the etching process. The material of the conductive film may be Indium Tin Oxides (ITO), Indium-doped Zinc Oxide (IZO), or metallic materials, such as molybdenum, aluminum, molybdenum-aluminum alloy, molybdenum-tungsten alloy and the like. The materials and the fabrication process of the gate lines 22 and the data lines 21 are not limited in the disclosed embodiments and may be modified according to the real situations.

Based on the above disclosed embodiments, in another embodiment, the thin film transistors located in the display region include at least one first thin film transistor, and the thin film transistors of the gate driving circuit include at least one second thin film transistor.

In the disclosed embodiments, the first thin film transistors located in the display region are used as the driving transistors to drive the display pixels, and the requirement of the high stability of the driving thin film transistors may be satisfied. The second thin film transistors of the gate driving circuit are used as the driving signal outputting transistors in the gate driving circuit, and the requirement of the high threshold voltage of the driving signal outputting thin film transistors may be also satisfied.

Figure 5:
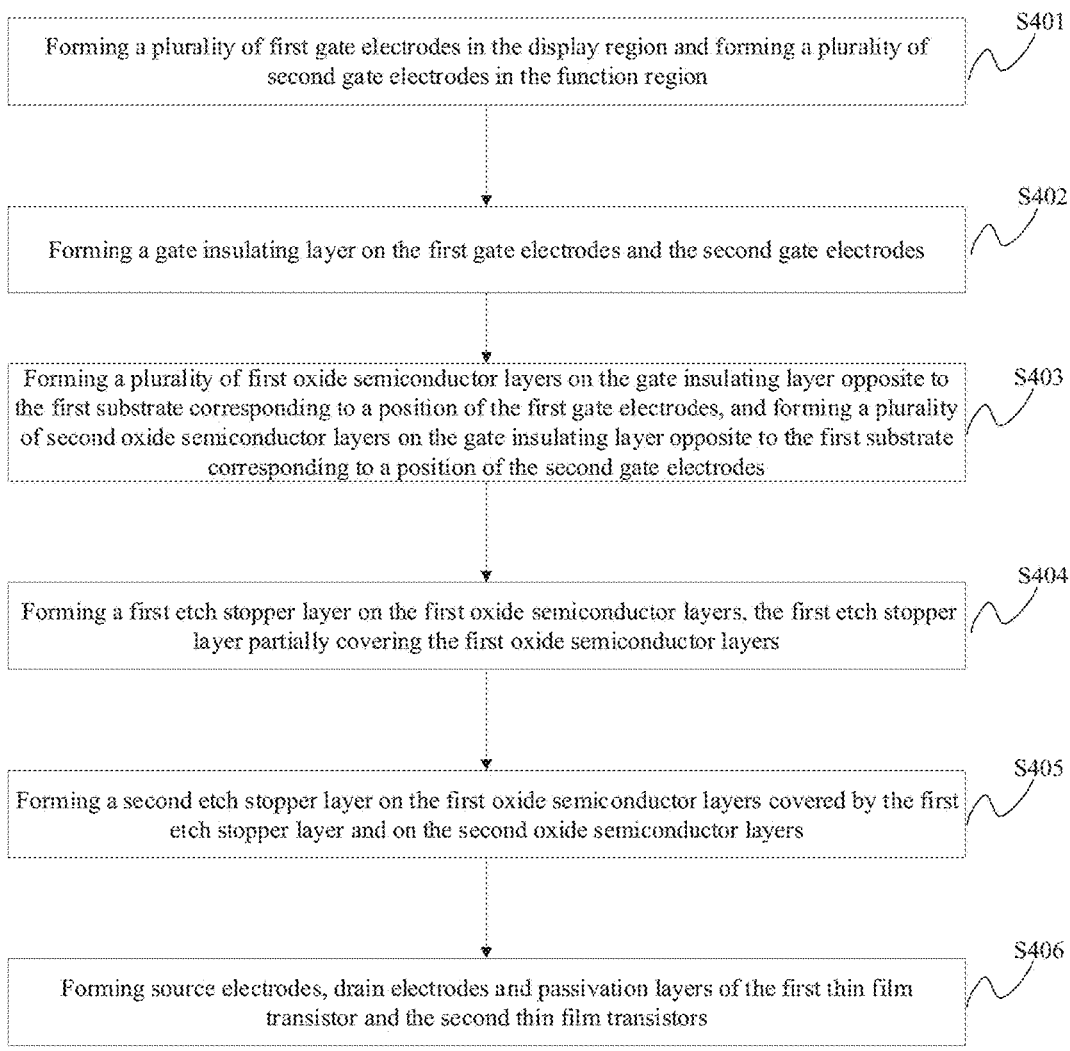
FIG. 5 illustrates a flow chart of an exemplary fabrication process of a first TFT and an exemplary second TFT consistent with disclosed embodiments.
Figure 6:
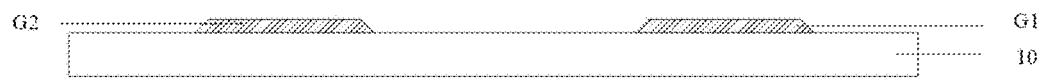
FIGS. 6-11 illustrate cross-sectional views of an exemplary first TFT and an exemplary second TFT consistent with disclosed embodiments.

FIG. 5 illustrates a flow chart of a fabrication process of an exemplary first thin film transistor and an exemplary second thin film transistor consistent with disclosed embodiments. As shown in FIG. 5, the fabrication process of the first thin film transistor and the second thin film transistor includes:

S401: Forming a plurality of first gate electrodes and a plurality of second gate electrodes on the surface of the first substrate. FIG. 6 illustrates a cross-sectional view of the first thin film transistor and the second thin film transistor on the first substrate 10 after performing step S401. As shown in FIG. 6, the first gate electrodes G1 and the second gate electrodes G2 are formed on the surface of the first substrate 10. FIG. 6 illustrates only one of the plurality of first gate electrodes G1 and one of the plurality of second gate electrodes G2 for example.

Figure 7:
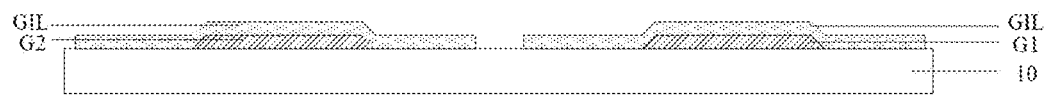

S402: Forming a gate insulating layer on the first gate electrodes and the second gate electrodes. FIG. 7 illustrates a cross-sectional view of the first thin film transistor and the second thin film transistor on the first substrate 10 after performing step S402. As shown in FIG. 7, the gate insulating layer GIL is formed on the substrate 10 covering the first gate electrode G1 and the second gate electrode G2. In other embodiments, the gate insulating layer GIL may cover whole surface of the first substrate 10 having the first gate electrode G1 and the second gate electrode G2.

Figure 8:
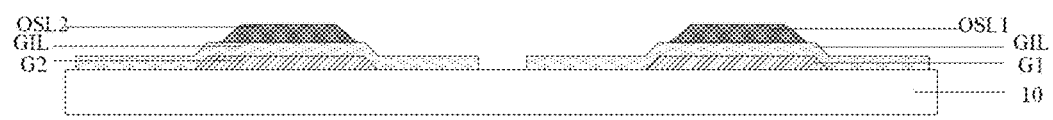

S403: Forming a plurality of first oxide semiconductor layers on the gate insulating layer opposite to the first substrate and corresponding to a position of the first gate electrodes, and forming a plurality of second oxide semiconductor layers on the gate insulating layer opposite to the first substrate and corresponding to a position of the second gate electrodes. FIG. 8 illustrates a cross-sectional view of the first thin film transistor and the second thin film transistor on the first substrate 10 after performing step S403. As shown in FIG. 8, the first oxide semiconductor layer OSL1 is formed on the gate insulating layer GIL opposite to the first substrate 10 and corresponding to the position of the first gate electrode G1; and the second oxide semiconductor layer OSL2 is formed on the gate insulating layer GIL opposite to the first substrate 10 and corresponding to the position of the second gate electrode G2. The first oxide semiconductor layer OSL1 and the second oxide semiconductor layer OSL2 are formed by the same process and have the same thickness.

Figure 9:
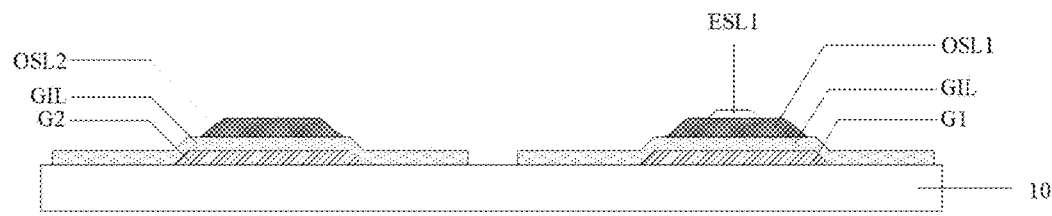

S404: Forming a first etch stopper layer on the first oxide semiconductor layers. The first etch stopper layer partially covers the first oxide semiconductor layers. FIG. 9 illustrates a cross-sectional view of the first thin film transistor and the second thin film transistor on the first substrate 10 after performing step S404. As shown in FIG. 9, the first etch stopper layer ESL1 is formed on the surface of the first oxide semiconductor layer OSL1. The first etch stopper layer ESL1 partially covers the first oxide semiconductor layer OSL1. The vertical projection of the first etch stopper layer ESL1 on the first substrate 10 is in the range of the vertical projection of the first oxide semiconductor layer OSL1 on the first substrate 10.

Figure 10:
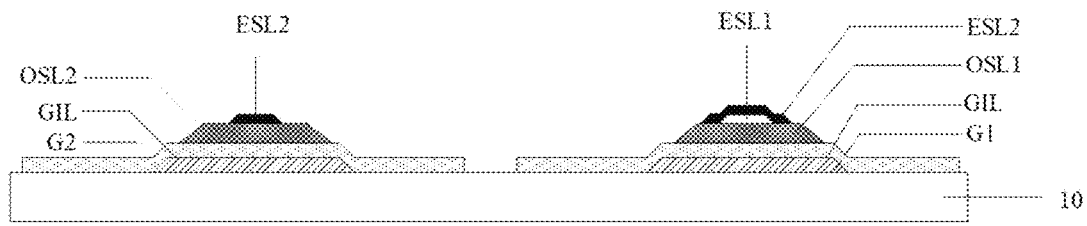

S405: Forming a second etch stopper layer on the first oxide semiconductor layers covered by the first etch stopper layer and on the second oxide semiconductor layers. FIG. 10 illustrates a cross-sectional view of the first thin film transistor and the second thin film transistor on the first substrate 10 after performing step S405. As shown in FIG. 10, the second etch stopper layer ESL2 is formed on the second oxide semiconductor layer OSL2. In the first thin film transistor, the second etch stopper layer ESL2 covers the first etch stopper layer ESL1, and the second etch stopper layer ESL2 also covers a portion of the first oxide semiconductor layer OSL1. The surface of the first oxide semiconductor layer OSL1 located on two sides of the second etch stopper layer ESL2 is exposed. Similarly, in the second thin film transistor, the second etch stopper layer ESL2 covers a portion of the second oxide semiconductor layer OSL2, and the surface of the second oxide semiconductor layer OSL2 located on two sides of the second etch stopper layer ESL2 is exposed.

In the disclosed embodiments, the second etch stopper layer ESL2 located on the first oxide semiconductor layer OSL1 covers the whole surface of the first etch stopper layer ESL1. In other words, the second etch stopper layer ESL2 located on the first oxide semiconductor layer OSL1 has an area larger than the first etch stopper layer ESL1. In other embodiments, the second etch stopper layer ESL2 located on the first oxide semiconductor layer OSL1 may cover only partial first etch stopper layer ESL1. In other words, the second etch stopper layer ESL2 located on the first oxide semiconductor layer OSL1 has an area smaller than the first etch stopper layer ESL1.

Figure 11:
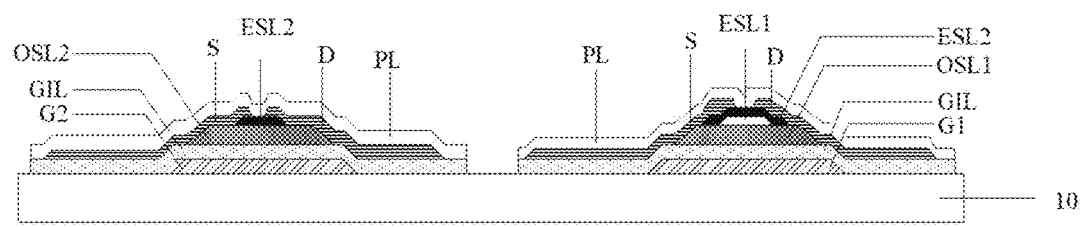

S406: Forming source electrodes, drain electrodes and passivation layers of the first thin film transistor and the second thin film transistors. FIG. 11 illustrates a cross-sectional view of the first thin film transistor and the second thin film transistor on the first substrate 10 after performing step S406. As shown in FIG. 11, the source electrodes S and the drain electrodes D individually contact the exposed oxide semiconductor layers at two sides of the second etch stopper layer ESL2. The passivation layer PL covers the source electrodes S, the drain electrodes D, the etch stopper layers and the gate insulating layers GIL.

It should be noted that the forming positions of the source electrodes S and the drain electrodes D of the thin film transistors are defined by the mask layer, and this feature is different from the metal-oxide-semiconductor field-effect transistor (MOSFET). In other words, the projection of the source electrodes S and the drain electrodes D on the first substrate 10 is at least partially overlapped with the projection of the gate electrodes G on the first substrate 10. The reason of this setting is that the electron channel of the thin film transistor is formed on one surface of the oxide semiconductor layer opposite to the source and drain electrodes. When the electron channel of the thin film transistor connects the source electrodes S and the drain electrodes D, the electron channel must go through the oxide semiconductor layer. When the projection of the source electrodes S and the drain electrodes D on the first substrate 10 is not overlapped with the projection of the gate electrodes G on the first substrate 10, a gap having no electron channel may be formed. The gap makes a huge resistance and lowers the charging ability of the thin film transistor.

In the disclosed embodiments, the material of the first etch stopper layer is different from the material of the second etch stopper layer, and/or the thickness of the first etch stopper layer is different from the thickness of the second etch stopper layer. In the disclosed embodiments, The material of the etch stopper layers may be silicon dioxide, silicon nitride, or aluminum oxide. The materials of the etch stopper layers are not limited in the disclosed embodiments and may be modified according to the real situations.

In the disclosed embodiments, the material of the first etch stopper layer is the same as the material of the second etch stopper layer, and the thickness of the first etch stopper layer is different from the thickness of the second etch stopper layer. In another embodiment, the material of the first etch stopper layer is different from the material of the second etch stopper layer, and the thickness of the first etch stopper layer is the same as the thickness of the second etch stopper layer.

In another embodiment, the material of the first etch stopper layer is different from the material of the second etch stopper layer, and the thickness of the first etch stopper layer is different from the thickness of the second etch stopper layer. The material and thickness of the etch stopper layers are not limited in the disclosed embodiments and may be modified according to the real situations.

It should be noted that, in the disclosed embodiments, the thickness of the second etch stopper layer is approximately 20 nm-400 nm including the endpoint values, and correspondingly, the total thickness of the etch stopper layer of the second thin film transistor is approximately 20 nm-400 nm including the endpoint values. The thickness difference between the whole etch stopper layer of the first thin film transistor and the whole etch stopper layer of the second thin film transistor is approximately 10 nm-300 nm including the endpoint values. The thickness of the second etch stopper layer is not limited in the disclosed embodiments. The thickness of the second etch stopper layer may be 20 nm, 100 nm, 200 nm or 400 nm according to the real situations. The thickness difference between the whole etch stopper layer of the first thin film transistor and the whole etch stopper layer of the second thin film transistor is also not limited in the disclosed embodiments. The thickness difference may be 10 nm, 100 nm, 200 nm or 300 nm according to the real situations.

Figure 12:
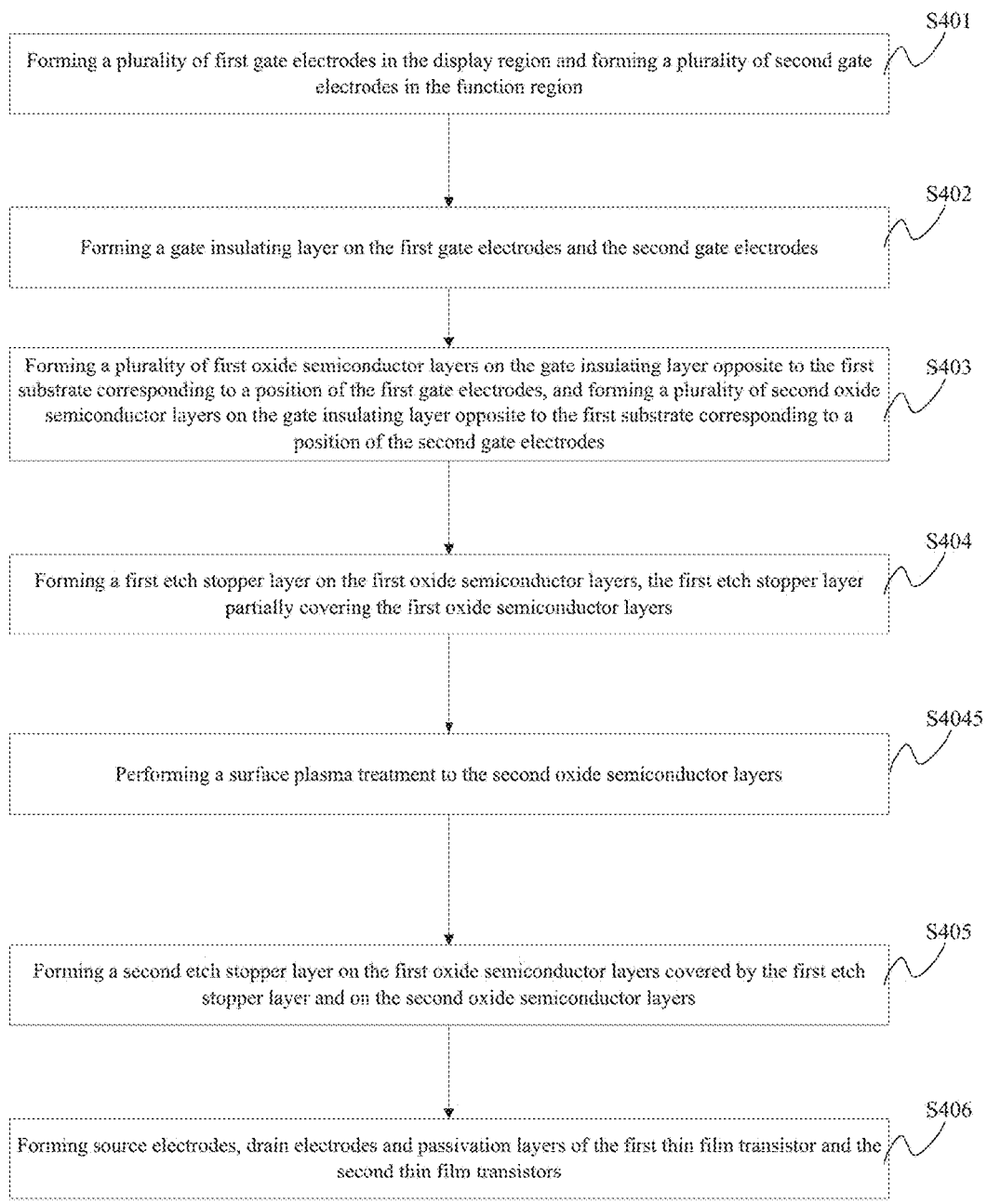
FIG. 12 illustrates a flow chart of another exemplary fabrication process of a first TFT and a second TFT consistent with disclosed embodiments.

FIG. 12 illustrates a flow chart of another exemplary fabrication process of an exemplary first thin film transistor and an exemplary second thin film transistor consistent with disclosed embodiments. As shown in FIG. 12, the method of forming the first thin film transistor and the second thin film transistor includes:

S401: Forming a plurality of first gate electrodes in the display region and forming a plurality of second gate electrodes in the function region;

S402: Forming a gate insulating layer on the first gate electrodes and the second gate electrodes;

S403: Forming a plurality of first oxide semiconductor layers on the gate insulating layer opposite to the first substrate and corresponding to a position of the first gate electrodes, and forming a plurality of second oxide semiconductor layers on the gate insulating layer opposite to the first substrate and corresponding to a position of the second gate electrodes;

S404: Forming a first etch stopper layer on the first oxide semiconductor layers, the first etch stopper layer partially covering the first oxide semiconductor layers;

S4045: Performing a surface plasma treatment to the second oxide semiconductor layers;

S405: Forming a second etch stopper layer on the first oxide semiconductor layers covered by the first etch stopper layer and on the second oxide semiconductor layers; and S406: Forming source electrodes, drain electrodes and passivation layers of the first thin film transistor and the second thin film transistors.

Figure 13:
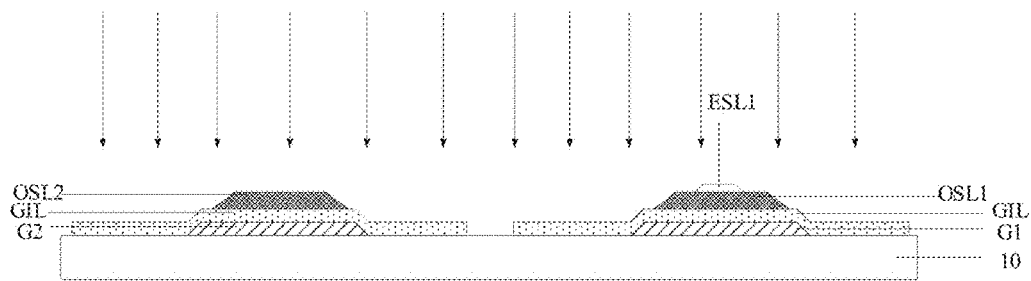
FIG. 13 illustrates a diagram showing an exemplary surface plasma treatment performed on a first TFT and a second TFT consistent with disclosed embodiments.

FIG. 13 illustrates a diagram showing an exemplary surface plasma treatment performed on a first thin film transistor and a second thin film transistor consistent with disclosed embodiments. As shown in FIG. 13, the arrows are used to show the plasma treatment. Because the first oxide semiconductor layer OSL1 is protected by the first etch stopper layer ESL1, the plasma treatment cannot directly treat the first oxide semiconductor layer OSL1 covered by the first etch stopper layer ESL. Thus, the threshold voltage of the second thin film transistor is further increased, and the influence to the threshold voltage of the first thin film transistor is lowered at the same time.

For example, by using the $N_2O$ gas to perform the plasma treatment, when the treatment time of the second oxide semiconductor layer OSL2 is longer and the treatment power is larger, the threshold voltage of the formed second thin film transistor is higher.

In the disclosed embodiments, the processes of forming the first etch stopper layer and forming the second etch stopper layer may be the same or different. For example, by using silicon dioxide as the etch stopper layer, when the silane gas flow of the etch stopper layer ESL forming process or the deposition power during the CVD process of forming the etch stopper layer is increased, the threshold voltage of the formed thin film transistor may be increased.

When the processes of forming the first etch stopper layer and forming the second etch stopper layer are the same, the thickness or the material of the first etch stopper layer may be different from that of the second etch stopper layer so as to ensure that the threshold voltage of the second thin film transistor is higher than the threshold voltage of the first thin film transistor.

In other embodiments, the processes of forming the first etch stopper layer and forming the second etch stopper layer are different. The film-forming power of the first etch stopper layer may be smaller than the film-forming power of the second etch stopper layer, the film-forming temperature of the first etch stopper layer may be higher than the film-forming temperature of the second etch stopper layer; or the film-forming pressure of the first etch stopper layer may be smaller than the film-forming pressure of the second etch stopper layer. When silicon dioxide is used as the etch stopper layers, the silane gas flow in the film-forming process of the first etch stopper layer may be higher than the silane gas flow in the film-forming process of the second etch stopper layer.

In the disclosed embodiments, an array substrate is further disclosed in FIG. 4 and FIG. 11. The array substrate includes the first substrate 10, and a plurality of first thin film transistors and a plurality of second thin film transistors located on the first substrate 10. The etch stopper layer of the second thin film transistor is different from the etch stopper layer of the first thin film transistors, and the threshold voltage of the second thin film transistors is higher than the threshold voltage of the first thin film transistors.

The first substrate 10 may be a glass substrate, a quartz substrate or a polyimide film substrate. The material of the first substrate 10 is not limited in the disclosed embodiments and may be modified according to the real situations.

It should be noted that, according to the present disclosure, when the threshold voltage of the thin film transistor used as the driving signal output in the gate driving circuit is less than 3V, an abnormal multi-pulse might be outputted by the gate driving circuit. When the threshold voltage of the thin film transistor used as the driving signal output in the gate driving circuit is less than 0V, the abnormal multi-pulse is surely outputted by the gate driving circuit. Thus, in the present application, the threshold voltage of the thin film transistor may be deemed as too low when the threshold voltage is less than approximately 3V.

Further, according to the present disclosure, the threshold voltage of the thin film transistor may be changed when either the film forming process, thickness or material of the etch stopper layer is changed. For example, when silicon dioxide is used as an etch stopper layer, the silicon dioxide is generally formed by the chemical vapor deposition (CVD) process and nitrous oxide gas and silane gas are generally used in the CVD process.

During the formation of silicon dioxide, when the ratio of nitrous oxide and silane is high, the oxide layer is oxidized sufficiently and the oxide layer has a less hydrogen content. Thus, the threshold voltage of the finally formed thin film transistor is higher. However, it may be possible to make the oxide layer having unstable oxygen doping as well, and the stability of the finally formed thin film transistor may be reduced (especially for the positive bias stability). When this kind of thin film transistors is used as the driving thin film transistor to form the pixel driving layer on the array substrate, the threshold voltage shifting will cause an abnormal image on the display panel using this array substrate (for example, residual images and brightness unevenness).

When the ratio of nitrous oxide and silane is low, the threshold voltage of the finally formed thin film transistor is low but the stability is high. When a higher film-forming power is used in the CVD process to form the silicon dioxide, the oxide material is sufficiently oxidized, and therefore the formed thin film transistor has a higher threshold voltage and a worse stability under the positive bias.

When the physical vapor deposition (PVD) process is used to form the silicon dioxide as the etch stopper layer, the silane gas is not required during the forming process of the silicon dioxide, and thus, the oxide semiconductor contains less hydrogen. Comparing to the thin film transistor having etch stopper layer formed by the CVD process, the thin film transistor having etch stopper layer formed by the PVD process may have a higher threshold voltage. When different materials are selected to form the etch stopper layer, the hydrogen contained in the oxide semiconductor layer may affect the threshold voltage of the finally formed thin film transistors.

In the disclosed embodiments, a plurality of first thin film transistors and a plurality of second thin film transistors having different threshold voltages are formed on the first substrate of the array substrate. The etch stopper layer of the second thin film transistor is different from the etch stopper layer of the first thin film transistor, and thus the threshold voltage of the second thin film transistor is higher than the threshold voltage of the first thin film transistor.

When the thin film transistors are used to form the gate driving circuit, the second thin film transistors with a high threshold voltage may be used for forming the driving signal outputting thin film transistors. Thus, the abnormal multi-pulse condition of the gate driving circuit caused by the low threshold voltage of the driving signal outputting thin film transistors may be avoided. When the thin film transistors are used to form the pixel driving layer, the first thin film transistors with a low threshold voltage may be used for driving the display pixels. The first thin film transistors have a better stability, and therefore the abnormal condition caused by the threshold voltage shifting may be avoided.

Based on the above disclosed embodiments, in another embodiment of the disclosure, the first substrate includes a display region and a function region. Returning to FIG. 2, FIG. 2 illustrates a top view of an exemplary first substrate consistent with disclosed embodiments. As shown in FIG. 2, the first substrate 10 includes the display region 11 and the function region 12. The display region 11 is located on one surface of the first substrate 10 and is in the central region of the surface. The function region 12 is the region on the first substrate 10 excepting the display region 11. For example, in FIG. 2, the function region 12 is located on one side of the display region 11. In other embodiments, the function region 12 may be located on two opposite sides of the display region 11.

Returning to FIG. 4, the array substrate further includes the pixel driving layer formed in the display region 11 and the gate driving circuit 25 formed in the function region 12. The pixel driving layer is formed by the thin film transistors located in the display region 11, including the gate lines 22 arranged along a first direction, the data lines 21 arranged along a second direction, and the thin film transistors located at a region defined by the gate lines 22 and the data lines 21. The gate driving circuit 25 is formed by the thin film transistors located in the function region 12.

In the disclosed embodiments, the pixel driving layer is formed on the surface of the display region 11 of the first substrate 10. The pixel driving layer includes the gate lines 22 arranged along a first direction, the data lines 21 arranged along a second direction, and the thin film transistors and the display pixel regions 23 located at a region defined by the gate lines 22 and the data lines 21. The display pixel regions 23 are used to form the pixel electrode. The gate driving circuit 25 is formed on the surface of the function region 12.

In the disclosed embodiments, the gate driving circuit 25 includes a plurality of thin film transistors (not shown). The second thin film transistors with a high threshold voltage are used for forming the driving signal outputting thin film transistors in the gate driving circuit 25. Therefore, the abnormal multi-pulse condition of the gate driving circuit 25 and the abnormal condition of the display panel caused by the low threshold voltage of the driving signal outputting thin film transistors may be avoided.

In the disclosed embodiments, the first thin film transistors and the second thin film transistors include the gate electrodes, the semiconductor layers, the source electrodes and the drain electrodes. When an open signal is inputted to the gate electrode, the carriers flow in the semiconductor layer and conduct the source electrode and the drain electrode. In the disclosed embodiments, the semiconductor layers of the first thin film transistors and the second thin film transistors are oxide semiconductor layers. Because the oxide semiconductor is sensitive to the moisture and the moisture may cause defects in the oxide semiconductor, the etch stopper layers are generally formed on the oxide semiconductor layers to insulate the moisture during the fabrication process.

As shown in FIG. 4, the array substrate further includes the data driving circuit 24. The data driving circuit 24 is electrically coupled to the data lines 21. The data driving circuit 24 outputs the display data signals to the display pixels during the display periods through the data lines 21, and therefore controls the images displayed on the display panel having the array substrate. The gate driving circuit 25 is electrically coupled to the gate lines 22. The gate driving circuit 25 provides the scanning signals to the first thin film transistors during the display periods through the gate lines 22, and therefore controls the opening or closing status of the first thin film transistors.

The gate lines 22 and the data lines 21 may be formed by using the magnetron sputtering process to form the conductive film, and forming the patterns after the etching process. The gate lines 22 and the data lines 21 may be also formed by using the thermal evaporation process or CVD process to form the conductive film, and forming the patterns after the etching process. The material of the conductive film may be Indium Tin Oxides (ITO), Indium-doped Zinc Oxide (IZO), or metallic materials, such as molybdenum, aluminum, molybdenum-aluminum alloy, molybdenum-tungsten alloy and the like. The materials and the fabrication process of the gate lines 22 and the data lines 21 are not limited in the disclosed embodiments and may be modified according to the real situations.

In the disclosed embodiments, the thin film transistors located in the display region include at least one first thin film transistor, and the thin film transistors in the gate driving circuit include at least one second thin film transistor.

In the disclosed embodiments, the first thin film transistors located in the display region are used as the driving transistors to drive the display pixels, and the requirement of the stability of the driving transistors can be satisfied. The second thin film transistors in the gate driving circuit are used as the driving signal outputting transistors in the gate driving circuit, and the requirement of the high threshold voltage of the driving signal outputting transistors can be also satisfied.

In the disclosed embodiments, referring to FIG. 4 and FIG. 11, the first thin film transistor includes a first gate electrode G1 located on the surface of the first substrate 10; a gate insulating layer GIL covering the first gate electrode G1; a plurality of first oxide semiconductor layers OSL1 located on the gate insulating layer GIL opposite to the first substrate 10 corresponding to a position of the first gate electrodes G1; a first etch stopper layer ESL1 located on the first oxide semiconductor layers OSL1, the first etch stopper layer ESL1 partially covering the first oxide semiconductor layers OSL1; a second etch stopper layer ESL2 located on the first oxide semiconductor layers and OSL1 covered the first etch stopper layer ESL1; source electrodes S and drain electrodes D individually located on two sides of the first etch stopper layer ESL1 and covering partial of the second etch stopper layer ESL2, the source electrodes S and the drain electrodes D have a projection on the first substrate 10 overlapping at least partial of the first gate electrode G1; and a passivation layer PL covering the source electrodes S, the drain electrodes D, the second etch stopper layer ESL2 and the gate insulating layer GIL.

The second thin film transistor includes a second gate electrode G2 located on the first substrate 10; a gate insulating layer GIL covering the second gate electrode G2; a plurality of second oxide semiconductor layers OSL2 located on the gate insulating layer GIL opposite to the first substrate 10 corresponding to a position of the second gate electrodes G2; a second etch stopper layer ESL2 located on the second oxide semiconductor layers OSL2, the second etch stopper layer ESL2 partially covering the second oxide semiconductor layers OSL2; source electrodes S and drain electrodes D individually located on two sides of the second etch stopper layer ESL2 and covering partial of the second etch stopper layer ESL2, the source electrodes S and the drain electrodes D have a projection on the first substrate 10 overlapping at least partial of the second gate electrode G2; and a passivation layer PL covering the source electrodes S, the drain electrodes D, the second etch stopper layer ESL2 and the gate insulating layer GIL.

It should be noted that, in the first thin film transistor, the second etch stopper layer ESL2 covers the first etch stopper layer ESL1, and the second etch stopper layer ESL2 also covers a portion of the first oxide semiconductor layer OSL1. The surface of the first oxide semiconductor layer OSL1 located on two sides of the second etch stopper layer ESL2 is exposed. Similarly, in the second thin film transistor, the second etch stopper layer ESL2 covers a portion of the second oxide semiconductor layer OSL2, and the surface of the second oxide semiconductor layer OSL2 located on two sides of the second etch stopper layer ESL2 is exposed.

The source electrodes S and the drain electrodes D individually contact the oxide semiconductor layer at the exposed portions located at two sides of the second etch stopper layer ESL2.

It should be noted that the forming positions of the source electrodes S and the drain electrodes D of the thin film transistors are defined by the mask layer, and this feature is different from the metal-oxide-semiconductor field-effect transistor (MOSFET). In other words, the projection of the source electrodes S and the drain electrodes D on the first substrate 10 is at least partially overlapped with the projection of the gate electrodes G on the first substrate 10. The reason of this setting is that: the electron channel of the thin film transistor is formed in one surface of the oxide semiconductor layer opposite to the source and drain electrodes. When the electron channel of the thin film transistor connects the source electrodes S and the drain electrodes D, the electron channel must go through the oxide semiconductor layer. When the projection of the source electrodes S and the drain electrodes D on the first substrate 10 is not overlapped with the projection of the gate electrodes G on the first substrate 10, a gap having no electron channel may be formed. The gap makes a huge resistance and lowers the charging ability of the thin film transistor.

In the disclosed embodiments, the second oxide semiconductor layer is an oxide semiconductor layer treated by a surface plasma treatment. It should be noted that the plasma treatment on the second oxide semiconductor layer may further increase the threshold voltage of the second thin film transistor. Specifically, by using the $N_2O$ gas to perform the plasma treatment as an example, when the treatment time of the second oxide semiconductor layer OSL2 is longer and the treatment power is larger, the threshold voltage of the formed second thin film transistor is higher.

In the disclosed embodiments, the material of the first etch stopper layer is different from the material of the second etch stopper layer, and/or the thickness of the first etch stopper layer is different from the thickness of the second etch stopper layer. The material of the etch stopper layers may be silicon dioxide, silicon nitride, or aluminum oxide. The materials of the etch stopper layers are not limited in the disclosed embodiments and may be modified according to the real situations.

In the disclosed embodiments, the material of the first etch stopper layer is the same as the material of the second etch stopper layer, and the thickness of the first etch stopper layer is different from the thickness of the second etch stopper layer. In the further disclosed embodiments, the material of the first etch stopper layer is different from the material of the second etch stopper layer, and the thickness of the first etch stopper layer is the same as the thickness of the second etch stopper layer. In the further disclosed embodiments, the material of the first etch stopper layer is different from the material of the second etch stopper layer, and the thickness of the first etch stopper layer is different from the thickness of the second etch stopper layer. The material and thickness of the etch stopper layers are not limited in the disclosed embodiments and may be modified according to the real situations.

It should be noted that, in the disclosed embodiments, the thickness of the second etch stopper layer is approximately 20 nm-400 nm including the endpoint values, and correspondingly, the total thickness of the etch stopper layer of the second thin film transistor is approximately 20 nm-400 nm including the endpoint values. The thickness difference between the whole etch stopper layer of the first thin film transistor and the whole etch stopper layer of the second thin film transistor is approximately 10 nm-300 nm including the endpoint values. The thickness of the second etch stopper layer is not limited in the disclosed embodiments. The thickness of the second etch stopper layer may be 20 nm, 100 nm, 200 nm or 400 nm according to the real situations. The thickness difference between the whole etch stopper layer of the first thin film transistor and the whole etch stopper layer of the second thin film transistor is also not limited in the disclosed embodiments. The thickness difference may be 10 nm, 100 nm, 200 nm or 300 nm according to the real situations.

In the disclosed embodiments, the processes of forming the first etch stopper layer and forming the second etch stopper layer may be the same or different. For example, by using silicon dioxide as the etch stopper layer, when the silane gas flow or the deposition power is increased during the CVD process of forming the etch stopper layers, the threshold voltage of the formed thin film transistor may be increased. When the processes of forming the first etch stopper layer and forming the second etch stopper layer are the same, the thickness or the material of the first etch stopper layer should be different from that of the second etch stopper layer so as to ensure that the threshold voltage of the second thin film transistor is higher than the threshold voltage of the first thin film transistor.

In other embodiments, the processes of forming the first etch stopper layer and forming the second etch stopper layer are different. The film-forming power of the first etch stopper layer may be smaller than the film-forming power of the second etch stopper layer; the film-forming temperature of the first etch stopper layer may be higher than the film-forming temperature of the second etch stopper layer; or the film-forming pressure of the first etch stopper layer may be smaller than the film-forming pressure of the second etch stopper layer. When silicon dioxide is used as the etch stopper layers, the silane gas flow in the film-forming process of the first etch stopper layer may be higher than the silane gas flow in the film-forming process of the second etch stopper layer.

Figure 14:
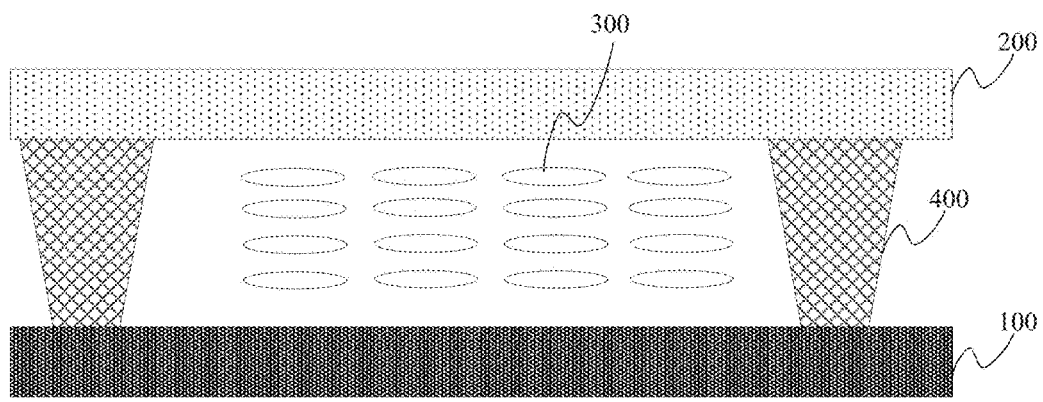
FIG. 14 illustrates a cross-sectional view of an exemplary display panel consistent with disclosed embodiments.

In the disclosed embodiments, a display panel is further disclosed. FIG. 14 illustrates a cross-sectional view of an exemplary display panel consistent with disclosed embodiments. As shown in FIG. 14, the display panel includes a counter substrate and an array substrate arranged oppositely. The array substrate 100 may be the array substrate 10 in the above embodiments. FIG. 14 further shows the liquid crystal layer 300 and the support structure 400 of the display panel.

Figure 15:
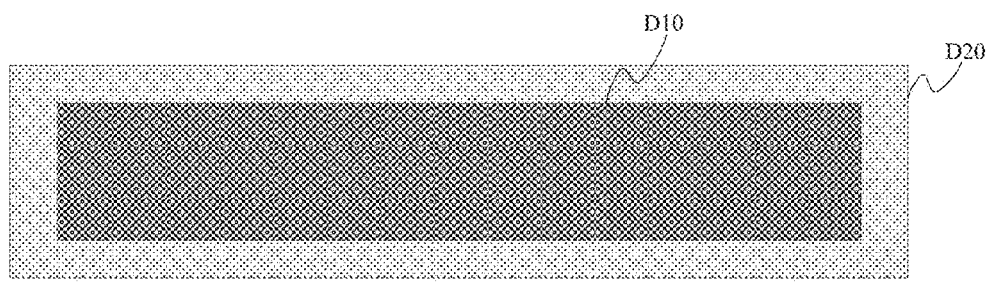
FIG. 15 illustrates a cross-sectional view of an exemplary display device consistent with disclosed embodiments.

In the disclosed embodiments, a display device is further disclosed. FIG. 15 illustrates a cross-sectional view of an exemplary display device consistent with disclosed embodiments. As shown in FIG. 15, the display device includes at least one display panel D10 described in the above embodiments. FIG. 15 further shows the packaging structure D20 of the display device.

Figure 16:
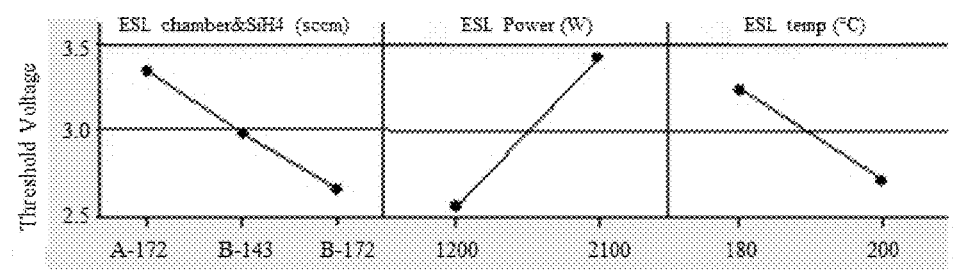
FIG. 16 illustrates a comparison of an exemplary array substrate fabricated under different process parameter factors.

FIG. 16 illustrates a comparison of an exemplary array substrate fabricated under different process parameter factors. As shown in FIG. 16, when the silane gas flow or the deposition power is increased during the forming process of the etch stopper layers, the threshold voltage of the formed thin film transistor may be increased. When the film-forming temperature is decreased during the forming process of the etch stopper layers, the threshold voltage of the formed thin film transistor may be increased.

In the disclosed embodiments, the array substrate 10 includes the first thin film transistors and the second thin film transistors. The etch stopper layer of the first thin film transistor is a two-layer structure, ESL1 and ESL2, as shown in FIG. 11. The etch stopper layer of the second thin film transistor is a single layer structure, ESL2, as shown in FIG. 11. In other embodiments, the etch stopper layer of the first thin film transistor may be a stacking structure formed by two or more layers of etch stopper materials. In the first thin film transistor, the processes of forming the first etch stopper layer ESL1 and forming the second etch stopper layer ESL2 may be the same or different; the materials of the first etch stopper layer ESL1 and the second etch stopper layer ESL2 may be the same or different; and the thickness of the first etch stopper layer ESL1 and the thickness of the second etch stopper layer ESL2 may be the same or different. In other embodiments, the first etch stopper layer ESL1 and the second etch stopper layer ESL2 may be treated by different plasma treatment processes.

The disclosed embodiments provide a display panel, a display device, an array substrate and a fabrication method thereof. The fabrication method of the array substrate includes forming a plurality of first thin film transistors and a plurality of second thin film transistors on the first substrate. The first thin film transistors are located in the display region to form the pixel driving layer of the display panel. The second thin film transistors are located in the function region to form the gate driving circuit. Because the etch stopper layers of the first thin film transistors and the etch stopper layers of the second thin film transistors are different, and the threshold voltage of the second thin film transistor is therefore higher than the threshold voltage of the first thin film transistor. The abnormal multi-pulse condition of the gate driving circuit and the display panel caused by the low threshold voltage of the second thin film transistors may be avoided.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for fabricating an array substrate, comprising:
   providing a first substrate; and
   forming a plurality of first thin film transistors and a plurality of second thin film transistors on the first substrate, wherein:
   each of the plurality of first thin film transistors includes a first oxide semiconductor layer formed over a first gate electrode, and a first etch stop layer and a second etch stop layer together formed over the first oxide semiconductor layer, wherein the first etch stop layer partially covers the first oxide semiconductor layer, the second etch stop layer encapsulates the first etch stop layer and partially covers the first oxide semiconductor layer, with a surface of the first oxide semiconductor layer located on two sides of the second etch stop layer exposed,
   each of the plurality of second thin film transistors includes a second oxide semiconductor layer formed over a second gate electrode, and another second etch stop layer formed over the second oxide semiconductor layer, wherein the another second etch stop layer partially covers the second oxide semiconductor layer, with a surface of the second oxide semiconductor layer located on two sides of the another second etch stop layer exposed,
   the second etch stop layer and the another second etch stop layer are different from the first etch stop layer, and
   a threshold voltage of the second thin film transistor is higher than a threshold voltage of the first thin film transistor.

2. The method for fabricating an array substrate according to claim 1, wherein the first substrate comprises a display region and a function region, after forming the plurality of first thin film transistors and the plurality of second thin film transistors on the first substrate, further comprising:
   forming a pixel driving layer by using the thin film transistors located in the display region, the pixel driving layer comprising a plurality of gate lines arranged along a first direction, a plurality of data lines arranged along a second direction, and the first thin film transistors located at a region defined by the gate lines and the data lines;
   forming a gate driving circuit by using the thin film transistors located in the function region.

3. The method for fabricating an array substrate according to claim 2, wherein
   the thin film transistors located in the display region comprise at least one first thin film transistor; and
   the thin film transistors in the gate driving circuit comprise at least one second thin film transistor.

4. The method for fabricating an array substrate according to claim 1, wherein forming the plurality of first thin film transistors and the plurality of second thin film transistors comprises:
   forming a plurality of first gate electrodes and a plurality of second gate electrodes on the first substrate;
   forming a gate insulating layer on the plurality of first gate electrodes and the plurality of second gate electrodes;
   forming a plurality of first oxide semiconductor layers on the gate insulating layer opposite to the first substrate corresponding to a position of the first gate electrodes, and forming a plurality of second oxide semiconductor layers on the gate insulating layer opposite to the first substrate corresponding to a position of the second gate electrodes;
   forming a plurality of first etch stop layers on the plurality of first oxide semiconductor layers, the plurality of first etch stop layers partially covering the plurality of first oxide semiconductor layers;
   forming a plurality of second etch stop layers on the plurality of first oxide semiconductor layers covered by the plurality of first etch stop layers and on the plurality of second oxide semiconductor layers; and
   forming source electrodes, drain electrodes and passivation layers of the plurality of first thin film transistors and the plurality of second thin film transistors, wherein:
   for each of the plurality of first thin film transistors, a source electrode and a drain electrode are individually located on two sides of the second etch stop layer and partially cover the second etch stop layer, and projections of the source electrode and the drain electrode onto the first substrate at least partially overlap with the first gate electrode,
   for each of the plurality of second thin film transistors, a source electrode and a drain electrode are individually located on two sides of the another second etch stop layer and partially cover the another second etch stop layer, and projections of the source electrode and the drain electrode onto the first substrate at least partially overlap with the second gate electrode, and the passivation layers cover the source electrodes, the drain electrodes, the plurality of second etch stop layers and the gate insulating layer.

5. The method for fabricating an array substrate according to claim 4, wherein a material of the plurality of first etch stop layers is different from a material of the plurality of second etch stop layers, and/or a thickness of the plurality of first etch stop layers is different from a thickness of the plurality of second etch stop layers.

6. The method for fabricating an array substrate according to claim 5, wherein the thickness of the plurality of second etch stop layers is approximately 20 nm-400 nm including the endpoint values, and a thickness difference between an etch stop layer of the first thin film transistor and an etch stop layer of the second thin film transistor is approximately 10 nm-300 nm including the endpoint values.

7. The method for fabricating an array substrate according to claim 4, after forming the plurality of first etch stop layers on the plurality of first oxide semiconductor layers, and before forming the plurality of second etch stop layers on the plurality of second oxide semiconductor layers, further comprising:

performing a surface plasma treatment to the plurality of second oxide semiconductor layers.

8. The method for fabricating an array substrate according to claim 7, wherein the plurality of first etch stop layers and the plurality of second etch stop layers are formed by a same process or by different processes.

9. The method for fabricating an array substrate according to claim 8, wherein a film-forming power of the plurality of first etch stop layers is lower than a film-forming power of the plurality of second etch stop layers, or a film-forming temperature of the plurality of first etch stop layers is higher than a film-forming temperature of the plurality of second etch stop layers, or a film-forming pressure of the plurality of first etch stop layers is lower than a film-forming pressure of the plurality of second etch stop layers, or when the plurality of first and second etch stop layers are silicon dioxide, a silane flow of a film-forming process of the plurality of first etch stop layers is higher than a silane flow of a film-forming process of the plurality of second etch stop layers.

* * * * *